United States Patent [19]
Bovio

[11] 3,968,488
[45] July 6, 1976

[54] ELECTRONIC KEYBOARD
[75] Inventor: Michele Bovio, Banchette, Italy
[73] Assignee: Ing. C. Olivetti & C., S.p.A., Ivrea (Turin), Italy
[22] Filed: Sept. 5, 1975
[21] Appl. No.: 610,700

[30] Foreign Application Priority Data
Sept. 18, 1974 Italy .................................. 69815/74

[52] U.S. Cl. ......................... 340/365 C; 340/365 R; 317/249 R
[51] Int. Cl.² ........................................... G08C 1/00
[58] Field of Search .................... 340/365 C, 365 A; 200/DIG. 1; 317/DIG. 2, 249 PB; 307/116

[56] References Cited
UNITED STATES PATENTS
3,710,209    1/1973    Webb .............................. 340/365 C OTHER PUBLICATIONS
J. J. Hagopian, "Encoding and Self-Checking Keyboard," vol. 9, No. 11, Apr. 1967, P. 1523, IBM Technical Disclosure Bull.

Primary Examiner—Thomas B. Habecker
Attorney, Agent, or Firm—Schuyler, Birch, Swindler, McKie & Beckett

[57]    ABSTRACT

An electronic keyboard comprises a plurality of depressable keys each one of which comprises a stem normally movable and connected through a spring to a metallic actuator. Each actuator is lodged in a supporting element jutting out from the stem and cooperates with a permanent magnet which retains it in a rest position. Upon the depression of a key, the corresponding spring is loaded and after a predetermined displacement of the key a shoulder of the supporting element cooperates directly with the corresponding actuator disengaging it from the permanent magnet. The actuator is then pushed by the action of the spring to a movable contact of an electronic switch which generates an electrical signal.

12 Claims, 4 Drawing Figures

ELECTRONIC KEYBOARD

BACKGROUND OF THE INVENTION

1. Field of Invention

The present invention relates to an electronic keyboard for a typewriter, a calculating machine, accounting machine or similar office machines, including a plurality of keys, a plurality of actuators connected by means of spring to the said keys, retaining means which hold the said actuators in the rest position and a plurality of circuit elements activated by the said actuators to generate the corresponding electrical signals, and in which each keys, during its depression, loads the spring of the corresponding actuator for the activation of the actuator itself.

2. Description of the Prior Art

A keyboard of the above type is already known in which each actuator has fixed to it a permanent magnet which, acting in unison with the metallic structural of the keyboard itself, holds the actuator in the rest position. In this keyboard, at the depression of a key the spring which connects the key itself to the actuator, is loaded, until the force applied by the spring to the actuator is such to overcome the attraction of the permanent magnet. In this manner the actuator is moved by the spring itself through the dynamic energy which it had stored up.

In a keyboard of this type, the releasing action depends exclusively on the force applied by the loaded spring. Therefore the stroke distance of the various keys may differ. This means that if the same stroke distance is required for all the key, all the springs and magnets must be precision set, thus inevitably causing the production of the keyboard to become expensive.

SUMMARY OF THE INVENTION

One object of this invention is to have a keyboard of capacitive type wherein the electrical signals corresponding to the depression of the keys are always generated after a predetermined displacement of the keys. Another object is to have a keyboard of small dimensions, high efficiency and operational reliability.

BRIEF DESCRIPTION OF THE DRAWING

The invention will be described in more detail, by way of example, with reference to the accompanying drawings, in which.

DESCRIPTION OF A PREFERRED EMBODIMENT OF THE INVENTION

Figure 1:
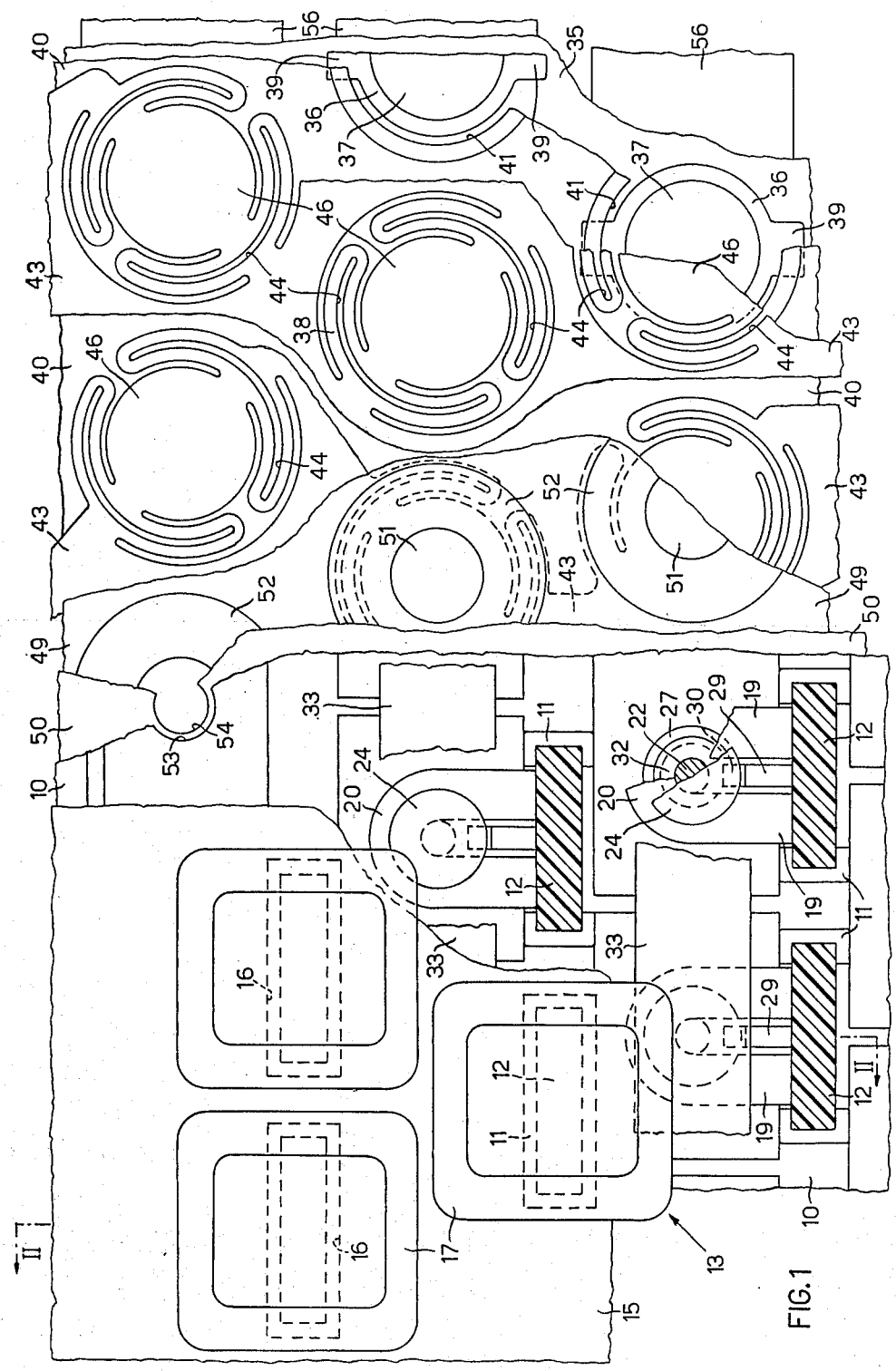
FIG. 1 is a plan view, partially in section, of a keyboard specified in the invention.

The keyboard shown in the drawings and described here below to illustrate the invention is of the capacitive type. This kind of keyboard is used in electrical typewriters, teleprinters, terminals, calculator consoles or in other devices for the automatic treatment of data.

With reference to FIG. 1, the keyboard specified in the invention includes a supporting frame 10, preferably plastic, on which there are vertical slots 11 rectangular in section inside which the stems 12 of a plurality of keys 13 (see also FIG. 2) can be slid up and down.

Above the frame 10 is a metallic plate 15 featuring apertures 15 in order to let the ends of the slots 11 to extend upwards. The top end of each stem 12 terminates in a cap 17 which carries the imprint of an alpha-numerical or operational symbol.

Figure 2:
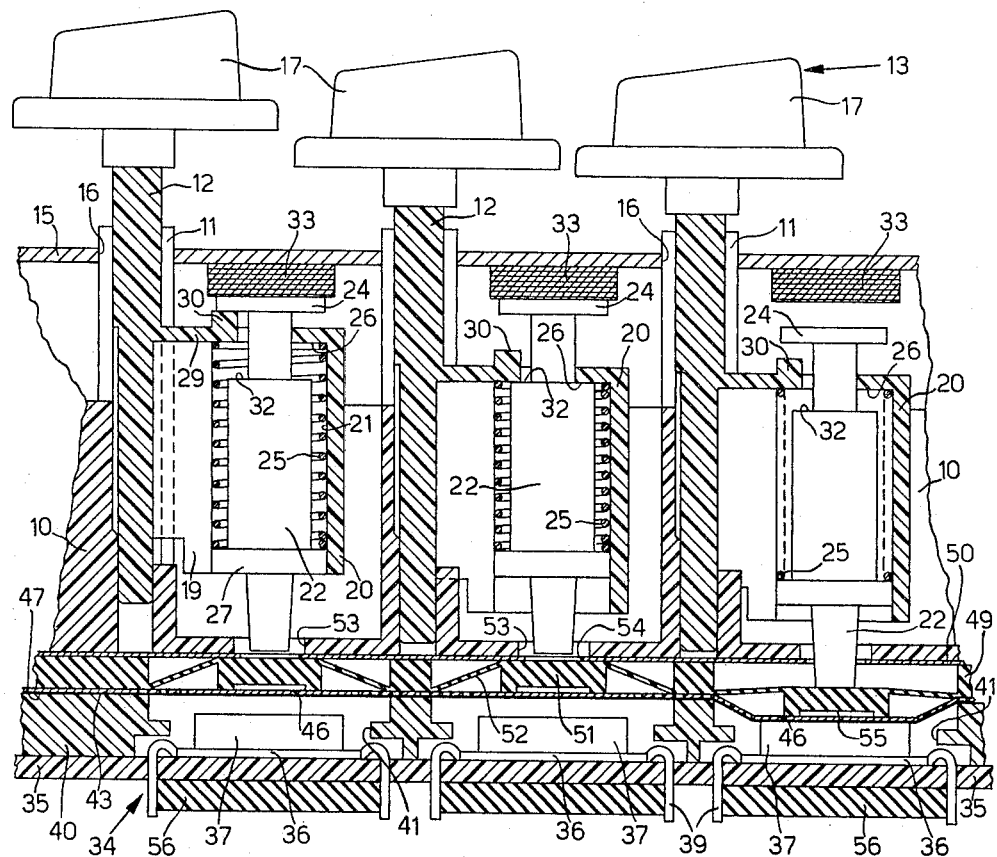
FIG. 2 is a section according to line II—II of FIG. 1.

Each stem 12 carries a supporting element fixed by means of two tongues 19. This supporting element consists of a substantially cylindrical body 20, inside which there is a cavity 21 (FIG. 2). Cavity 21 contains an actuator 22 which carries a disk 24, made of ferromagnetic material at its upper end, outside the cylinder 20.

A helical spring 25 is wound round the actuator 22 and is included compressed between an internal surface 26 of the cylinder 20 and a flange 27 of the said actuator 22. An appendix 29 is fixed between the tongues 19 of the stem 12. This appendix carries an appendix 30 against which, through the action of the spring 25, the disk 24 generally rests. The actuator in section shows an enlargement in the central part which defines a shoulder 32 with which the internal surface 26 of the cylinder 20 can collaborate.

Magnetic rubber strips are fixed onto the lower part of the plate 15 corresponding with the actuators 22 and keep these normally attracted upwards with a predetermined degree of magnetic force, e.g. of 80 grams. Circuit means are fixed below the frame 10 in order to generate an electric signal on the depression of a key 13. Since this concerns a capacitive keyboard, in this particular case these means 34 include a plate 35 made of insulating material, which is fixed in any known way to the frame 10 above. Co-axial to the actuators 22, small metal plates 36 are fixed onto the plate 35 onto each of which is fixed a disk 37 made of electricity-conducting rubber which makes up the fixed armature of a corresponding capacitor. Each plate 36 is connected to a printed circuit on the lower part of the isolating plate 35, using two terminals 39.

A plurality of flexible metal tongues 43 (FIG. 1), e.g. made of phospherous bronze, are fixed parallel to the plate 35 and supported by a single plastic plate 40 with holes corresponding to the disks 37.

The flexible tongues 43 corresponding to each plate disk 37 have circular notches 44 which made up an active part of small flexible half-eliptic spring 46 which makes lip the movable armature of the capacitor. The notches 44 in particular, constitute arms 38 which connect the active part 46 with the passive part of the flexible tongue 43. The arms 38 are approximately U-shaped so that their length is considerably longer than the distance between the active flexible tongue 43, thus allowing the part 46 to make a movement of considerable dimensions in relation to the level of the flexible tongue 43. Moreover the attaching zones of the arms 38 to the active part 46 and to the passive part of the flexible tongue 43 are largely in line with each other and symmetrical so as to prevent rotation and strain by the active part. The lower part of the flexible tongue 43 (FIG. 2) is covered with a layer 47 of insulating resin which functions dielectrically between the two armatures of the condenser.

A rubber pad 49 and a metal screen are fixed between the flexible tongues 43 and the frame 10. The pad 49 (FIG. 1) is formed so as to present a cylindrical central zone 51 and a thinner peripheral ring-shaped zone which corresponds to each actuator 22. The latter zone 52 is a frusto conical form (FIG. 2) with the point upwards so as to connect the upper part of the central zone 51 with the lower part of the rest of the pad 49.

Each central zone 51 has a recess 55 which limits the contact surface between the flexible spring 46 and the zone 51 itself thus creating an air chamber. The frame 10 and the screen 50 features through holes 53 respectively co-axial to each other, which correspond to each actuator 22. Strips 56 of rubbery material are fixed below the plate 35, between the terminals 39. These strips are used to deaden the noise made by the depression of the keys.

Figure 4:
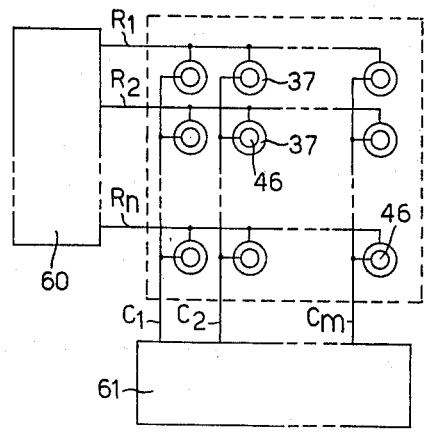
FIG. 4 is an electrical plan of the keyboard specified in the invention.

In this particular embodiment the keyboard uses a circuit system of the scanning type and the various capacitive elements are organised according to a matrix of lines and columns as shown in FIG. 4.

The keys 13 are lined upon N lines and M columns. The magnetic rubber strips 33 (FIG. 1) are also arranged in N parallel lines so that each strip collaborates with all the actuators 22 of the same line of keys 13. The movable armatures 46 (FIG. 4) of each column of keys derive from a single flexible tongue 43 and are electrically connected to common conductors $C_1, C_2, \ldots C_m$ while the fixed armatures 37 of each line are electrically connected to common conductors $R_1, R_2, \ldots R_n$.

A decoding circuit 60 is connected to conductors $R_1, R_2 \ldots R_n$ in order to energize the fixed armature lines sequentially with voltage impulses and a sensor circuit 61 is connected to conductors $C_1, C_2, \ldots C_m$ in order to show up the corresponding voltage signals sequentially in the M columns of the movable armature 46. The decoding circuit 60 and the sensor circuit 61 are connected in a known way together with a logical circuit, known per se and not shown in the drawings. The working of the keyboard described hereto is the following.

Under rest conditions all movable armatures 46 are spaced away from the corresponding fixed armatures 37, since all the actuators 22 have moved upwards, attracted by the magnetic rubber strips 33 (left-hand key in FIG. 2). Under these conditions, the capacity between the armatures of each condenser is of approximately 5pF. The stems 12 of the keys 13 are also moved upwards due to the springs being pre-loaded to the extent of about 40 grams.

By applying pressure to the cap 17 of a key 13, its stem 12 moves downwards against the action of the spring 25. With the resulting compression the spring stores a certain amount of dynamic energy.

After a stroke length of about 2,6 mm, the key 13 arrives with the internal surface 26 of the cylinder 20 against the shoulder 32 of the actuator 22, which had remained immobile, held by the magnetic rubber (central key in FIG. 2). After this stroke length the key 13 operates directly and positively on the actuator 22, and the spring 25 reaches a load of about 55 grams (a–b line in FIG. 3). Under these conditions, by increasing the pressure on key 13 until the magnetic attraction of the magnetic rubber is overcome (approx. 80 gr.; point c in FIG. 3). The actuator 22 is also moved downwards. Since the release action is very rapid, the operator has the clear sensation of the yielding of the key, and thus of the activation achieved.

As soon as it is released from the rubber 33, the actuator 22 is in fact driven by said spring 25 and is moved abruptly downwards. The actuator 22 in its turn bends both the rubber pad 49 and the spring 46 below (right-hand key in FIG. 2).

The only dielectric layer 47 is in this position, between the fixed armature 37 and the movable armature 46, and the capacity passes to a value of about 100 pF. The oscillations around the value achieved are eliminated through the presence of the air chamber in the recess 55. The variation in capacity is shown up by the sensor circuit 61, which generates an electrical impulse transmitted in its turn to a coding circuit not shown in the drawings.

Figure 3:
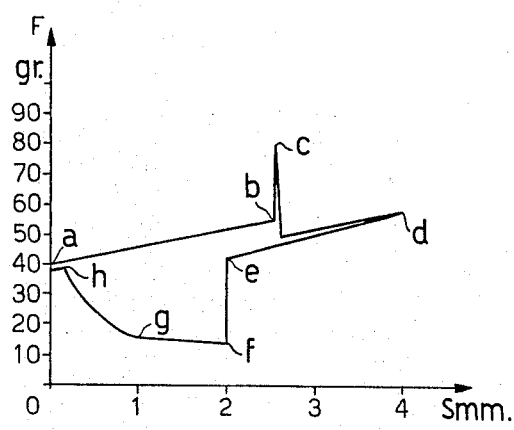
FIG. 3 is a diagram which represents the movement of a key in relation to the force applied to it.

By continuing to lower the key 13, the spring 25 is compressed to the point when the stem 12 reaches the end of the stroke distance (point d in FIG. 3).

When the key 13 is released, after its actuation, the flexible spring 46 and the flexed part of the pad 49 combine to bring the whole system to the rest position.

In particular the return-to-rest movement of the actuated key 13 occurs according to the curve shown in the diagram of FIG. 2. From points d to e the forces which combine to bring the key up are those of the spring 25 which expands and those of the flexible spring 46 and the pad 49 which return to stability conditions. As regards the particular form of the ring-shaped zone 52, the elastic reaction of this is largely consistent from the beginning to the end of the depression of the central zone 51.

When the appendix 30 of the appendix 29 (point e) makes contact with the disk 24, the action of the spring 25 is lacking and thus, between points f and g of the diagram, the forces which press the actuator 22 and the key 13 upwards, are those supplied by the small flexible spring 46, by the pad 49 and in part that of the attraction of the magnetic rubber 33.

From points g to h, the attraction force of the rubber 33 prevails over the others up to the point where it is strong enough to compress the spring 25, and make sure that the actuator 22 is at rest before the key 13. With the expansion of the spring 25, the key 13 is also returned to the rest position.

It is obvious that modifications or adjustments may be made to the following version without leaving the sphere of the present invention.

For example, the means for generating an electric signal on the depression of a key may be of the inductive, instead of the capacitive, type.

Moreover the connection between the various movable armatures, instead of being made following a system of lines and columns, may be carried out by dividing the keys into homogeneous groups, and by getting the armatures of each groups out of a single flexible bronze tongue.

What I claim is:

1. In an electronic keyboard for a typewriter, calculating machine, accounting machine or similar office machine, comprising a frame having an upper wall and a lower wall which defere a space therebetween, said frame having a plurality of slot means, a plurality of depressable keys, each one comprising a stem lodged in one corresponding of said slot means, a plurality of actuators individually associated to said keys, and a plurality of circuit means comprising each one a capacitor having a fixed armature and a movable armature opposite to said fixed armature, each actuator including an elongated member having a first end for actuating the movable armature of the corresponding capacitor to generate corresponding electrical signals, the combination comprising:

a supporting member putting out from each one of said stems and having a cavity therein in which one corresponding of said actuators is slidably supported;

a second end of each one of said actuators opposite to said first end and supporting a ferromagnetic element thereon;

magnetic retaining means lodged in said space and supported by said upper wall to hold the second end of the elongated member in a rest position of said actuator;

a first and a second shoulder element adjacent to the first and respectively to the second end of said elongated member; and a plurality of helicoidal springs each one lodged in said cavity to surround said elongated member and compressed between said first shoulder element and an internal surface of said cavity to arrest said second shoulder against said supporting member to push the first end of said actuator toward said movable armature when the ferromagnetic element of said actuator releases said magnetic retaining means upon the depression of said keys.

2. An electronic keyboard according to claim 1, wherein each one of said elongated member has a third shoulder element and wherein said internal surface of said cavity cooperates directly with the corresponding third shoulder element at the end of the depression of the key to positively overcome the action of said magnetic retaining means.

3. An electronic keyboard according to claim 1, wherein said keys are arranged aligned along a plurality of parallel lines and wherein said magnetic retaining means comprises a plurality of strips of rubber material placed parallel therebetween adjacent to said lines of keys.

4. An electronic keyboard according to claim 1, further comprising a support wall opposite said lower wall and supporting the fixed armature of said capacitors, a layer of deformable elastic material hermetically sealing said capacitors between same and said support wall, said layer being placed between said actuators and the movable armature of said capacitors and having, in correspondence of each one of said actuators a fixed peripheral section superposed to said support wall and a depressable central zone connected with the peripheral section with said flexible portion through a pad and of the layer through an intermediate section shaped substantially like a truncated cone with the vertex upwards to ensure a substantially constant elastic reaction to the actuated actuator when the corresponding key is depressed.

5. An electronic keyboard according to claim 1, wherein the movable armature of said capacitors is formed of a flexible conductive plate, said plate having a plurality of notches therein, which define a plurality of flexible portions connected to a fixed portion of said plate by connecting arms integral to said flexible portion and said fixed portions and symmetrically arranged between said flexible portion and said fixed portion of said plate, said arms being of a length greater than the distance between said flexible portion and said fixed portion, and having a substantially U shaped form in manner that the zones of said arms adjacent said flexible portion and said fixed portion are substantially aligned and symmetrical to prevent the rotation of said flexible portion with respect to the fixed portion of said plate during the contact of said layer with said fixed armature.

6. An electronic keyboard for a typewriter, calculating machine, accounting machine or similar office machine, comprising a frame; a plurality of depressable keys mounted on said frame; a plurality of actuators individually connected to said keys; a plurality of capacitors, individually associated to said actuators, and each one comprising a fixed armature and a movable armature formed of a flexible conductive plate, said plate having notched therein a fixed portion and a flexible portion approachable to said fixed armature by one of said actuators corresponding to one depressed of said keys to effect a change of capacitance between said fixed and movable armature; circuit means responsive to said change of capacitance to generate signals corresponding to the depressed key and means for insuring a constant value of said change of capacitance, said means comprising a block of conductive elastomeric material disposed between the flexible portion of said plate and said fixed armature at electrical contact with said fixed armature and a thin layer of insulating material disposed on a face of said flexible portion faced towards said block, so that the actuator of the depressed key causes the layer of insulating material of said flexible portion to uniformly contact said block.

7. An electronic keyboard according to claim 6, wherein said flexible portion is connected with said fixed portion through connecting arms of said plate having base ends thereof equally spaced about said flexible portion, said arms being integral to said fixed portion and extending inwardly therefrom into said flexible portion; each one of said arms being of a length greater than the shortest distance between its base end and said flexible portion to thereby facilitate flexing of said arms toward said block while supporting said flexible portion parallel thereto for substantially linear movement upon approaching thereof toward said block.

8. An electronic keyboard according to claim 6, wherein connecting arms integral to said flexible portion and to said fixed portion are symmetrically arranged between said flexible portion and said fixed portion of said plate, and are of a length greater than the distance between said flexible portion and said fixed portion, said arms having a substantially U shaped form in manner that the zones of said arms adjacent said flexible portion and said fixed portion are substantially aligned and symmetrical to prevent the rotation of said flexible portion with respect to the fixed portion of said plate during the contact of said layer with said block.

9. An electronic keyboard according to claim 6, further comprising means to damp vibrations of the flexible portion of said plate during the actuation of said actuators, said means comprising a layer of deformable elastic material placed between said actuators and said metal flexible plate and having in correspondence of each one of said actuators a fixed peripheral section and a central zone depressable by the corresponding actuator, each one of said central zones contacting the flexible portion of said plate and having a cavity for limiting the surface of contact between said layer and said plate whereby damping said vibrations.

10. An electronic keyboard according to claim 9, wherein said circuit elements are disposed in line on a plurality of lines, further comprising a plurality of strips of sound deadening material disposed along said lines under said fixed armatures.

11. An electronic keyboard for a typewriter, calculating machine, accounting machine or similar office machine, comprising a frame, a plurality of depressable keys mounted on said frame, a plurality of actuators individually connected to said keys, a plurality of capacitors individually associated to said actuators, and each one comprising a fixed armature and a movable armature formed of a flexible conductive plate, said plate having notched therein a fixed portion and a flexible portion approachable to said fixed armature by one of said actuators corresponding to a depressed of said keys to effect a change of capacitance between said fixed and movable armature, and circuit means responsive to said change of capacitance to generate signals corresponding to the depressed key and means insuring a big and repetitive value of said change of capacitance, said means comprising arm means of said flexible plate connecting said flexible portion with said fixed portion said arm means having base ends thereof equally spaced about said flexible portion, said arm means being integral to said fixed portion and extending inwardly therefrom into said flexible portion and each one of said arm means being of length greater than the shortest distance between its base end and said flexible portion to thereby facilitate flexing of said arms toward said fixed armature while supporting said flexible portion parallel thereto for substantially linear movement upon approaching thereof toward said fixed armature.

12. An electronic keyboard according to claim 11, wherein said plurality of keys comprises a series of modules of keys associated to a corresponding series of modules of said capacitors, the movable armatures of the capacitor of said series of modules being formed by single plates electrically insulated therebetween, and the fixed armatures having individual conductors connected thereto, and wherein said circuit means comprise a scanning sensor circuit having a first portion including input terminals each one connected with one of said single plate and a second portion including output terminals individually connected with the individual conductors of the fixed armature of each module.

* * * * *